United States Patent [19]

Dureux

[11] Patent Number: 4,518,991
[45] Date of Patent: May 21, 1985

[54] APPARATUS FOR STORING AND PROCESSING ANALOGUE SIGNALS TO BE DISPLAYED AS AN OSCILLOSCOPIC IMAGE AND OSCILLOSCOPE COMPRISING SUCH APPARATUS

[75] Inventor: Pierre J. C. Dureux, Corbeil-Essonnes, France

[73] Assignee: U.S. Philips Corporation, New York, N.Y.

[21] Appl. No.: 421,609

[22] Filed: Sep. 22, 1982

[30] Foreign Application Priority Data

Sep. 28, 1981 [FR] France ............................... 81 18212

[51] Int. Cl.³ .............................................. H04M 7/18
[52] U.S. Cl. ........................................ 358/93; 358/139
[58] Field of Search ...................... 358/244, 244.1, 93, 358/222, 160, 166, 167, 139, 107, 168, 169, 174; 350/20

[56] References Cited

U.S. PATENT DOCUMENTS 2,936,333  5/1960  Higdon et al. ....................... 358/244
4,141,642  2/1979  Nagai et al. .......................... 358/244

FOREIGN PATENT DOCUMENTS 47-51008  12/1972  Japan ................................... 358/244

OTHER PUBLICATIONS

Warren H. Miller, Jr., "A Stable Optical Structure for Hard Copy Displays", Aug. 25-26, 1977, S.P.I.E. vol. 121, Optics In Adverse Environments, (1977).

Primary Examiner—John C. Martin
Assistant Examiner—Edward L. Coles
Attorney, Agent, or Firm—Paul R. Miller

[57] ABSTRACT

An apparatus for the storage and processing of analog signals which are stored temporarily in an analog memory, formed by the target of a camera, is provided with the analog signals being converted into video frequency signals by means of a video scanning system of the camera. The signals are subsequently processed by a processing circuit comprising digitizing, storage and restitution circuits, a monitor forming the actual display means for the oscilloscopic image, a sequencer control circuit which carries out the principal synchronization and control functions, and an operator control panel.

10 Claims, 10 Drawing Figures

APPARATUS FOR STORING AND PROCESSING ANALOGUE SIGNALS TO BE DISPLAYED AS AN OSCILLOSCOPIC IMAGE AND OSCILLOSCOPE COMPRISING SUCH APPARATUS

The invention relates to apparatus for storing and processing arbitrary analogue signals which, after the electrical event to which they correspond, appear as a luminous trace called a write signal and is stored as an electric-charge pattern in a temporary analogue memory such a light-integrating target, with the processing being effected mainly in digital form in view of the subsequent display of an oscilloscopic image on a display device on which two orthogonal axes are defined, one with a time scale and the other with an amplitude scale, and the electric signals obtained by reading the charge pattern of the luminous trace in their turn being converted into video-frequency signals by a video preamplifier, if desired, in conjunction with a circuit for correcting irregularities of the analogue storage circuit. The invention also relates to an oscilloscope equipped with such an analogue-signal storage and processing apparatus.

BACKGROUND OF THE INVENTION

The oscilloscope, which is a highly appreciated universal measuring instrument because it presents results in graphical form, is eminently suitable for an overall and rapid analysis of phenomena to be examined. However, in the case of phenomena which are non-recurrent or which have a low repetition rate the results do not remain available long enough to permit such an analysis by the user. Moreover, such results cannot readily be transferred to an electronic processing or analyzing apparatus.

Therefore, it has become necessary to equip the oscilloscope with an apparatus for digitizing and storing the signals, for example an analogue-to-digital converter with real-time input to a digital memory. The acquisition rate depends on the conversion speed of the converter, which prohibits the use of this technique in very fast digital oscilloscopes unless the apparatus is preceded by an acquisition system which comprises an analogue memory whose real-time input is provided by a high-speed writing device. The well-known general principle is shown in FIG. 1, with the following operations being effected: acquisition (A1) of the signals (S) corresponding to the phenomenon to be examined by fast writing (A2) into an analogue memory, read-out (B) of this memory, analogue-to-digital conversion (C), digital storage (D), display (E2) after digital-to-analogue conversion (E1).

SUMMARY OF THE INVENTION

It is an object of the invention to provide an apparatus for storing and processing analogue signals, which apparatus is suitable for incorporation into an oscilloscope intended for universal use, i.e. which adapts itself to different types of signal waveforms (lines, surfaces, two alternating traces etc. . . ) and which can be used with a full range of sweep times (from at least a few nanoseconds to a few seconds).

To this end a storage and processing apparatus as defined in the foregoing is characterized in that:

(A) the temporary analogue memory is the target of a camera and conversion into video-frequency signals is effected by means of a video scanning system of the camera, which system scans the analogue memory in consecutive scanning lines parallel to the amplitude axes of the display means and thereby ensures that the television lines of the scanning operation corresponds to time windows; and (B) the processing circuit, which is arranged after the video preamplifier, comprises the following stages:

(1) a circuit for detecting the average black level corresponding to the used part of the analogue memory, which circuit receives the output signal of the video preamplifier and serves to generate a reference threshold value by adding a constant voltage to the detected average black level value;

(2) an analogue comparator which receives the output signal of the video preamplifier on a first input and the reference threshold value on a second input, which comparator supplies a logic "1" signal only during the time intervals in which the output signal exceeds the threshold value;

(3) a signal regenerator which is adapted to become operative when, within one of the time windows of the video scanning system of the camera, the instantaneous write signal reaches the maximum writing speed that can be stored and, consequently, portions of the signal written into the analogue memory are lost because the energy of the write signal, which is stored pointwise, has become too small along the television line situated in the window and the reference threshold value can no longer be reached permanently, taking into account the maximum brightness of the write beam for the analogue memory, the brightness setting of the write beam for which a relatively thin horizontal trace can be obtained and also the maximum sensitivity of the scanning camera and the various noise sources such as the video preamplifier, the signal regeneration being operative only when the missing trace portions each have a duration smaller than a predetermined value;

(4) a conversion circuit for converting the binary logic signal on the output of said regenerator into a pulse train of the same duration with the limit of the duration for which the missing trace portions are restored being equal to at least a few pulse periods;

(5) a change detector which detects the positions of the rising and falling edges of the output signal of the conversion circuit, which detector serves to supply pulse signals indicating the beginnings and ends of the trace segments;

(6) a digital memory for storing the positions of the beginnings and ends of the trace segments, which memory is loaded, on command, via an input buffer register with quantized values on the amplitude axis of the display means, which values are defined by a digitization counter and serve to indicate the positions of the pulse signals which mark the beginnings and ends of the trace segments during the scanning of each television line;

(7) a circuit for the restitution of the positions of the instants which are characteristic of the beginning or end of a trace segment on the time axis, which circuit, via an output buffer register, receives the values read into the digital memory;

(8) a circuit for reconstructing the trace segments between the positions of the beginnings and ends of the segments;

(9) a television monitor forming the actual display means for the oscilloscopic image, which monitor enables the contents of the digital memory to be displayed permanently with the contents being the information which corresponds to the write signal present in the analogue memory;

(10) a sequence control circuit, which serves in particular to provide the synchronous supply of a clock signal for scanning the analogue memory formed by the video scanning system of the camera and a clock signal for the conversion of the binary logic signal on the output of the signal regenerator, to control the clock signals for the digital memory, and to provide the entire operator/write-circuit communication, and

(11) a control panel to which the operator has access.

This apparatus is found to be very interesting because, although it provides a novel solution for the main processing circuit and the associated auxiliary circuits, it can be formed by means of standard components.

BRIEF DESCRIPTION OF THE DRAWINGS

Other features and advantages of the invention will be apparent from the following description and accompanying drawings, given by way of non-limitative example, and in which.

DESCRIPTION OF PREFERRED EMBODIMENTS

Figure 1:
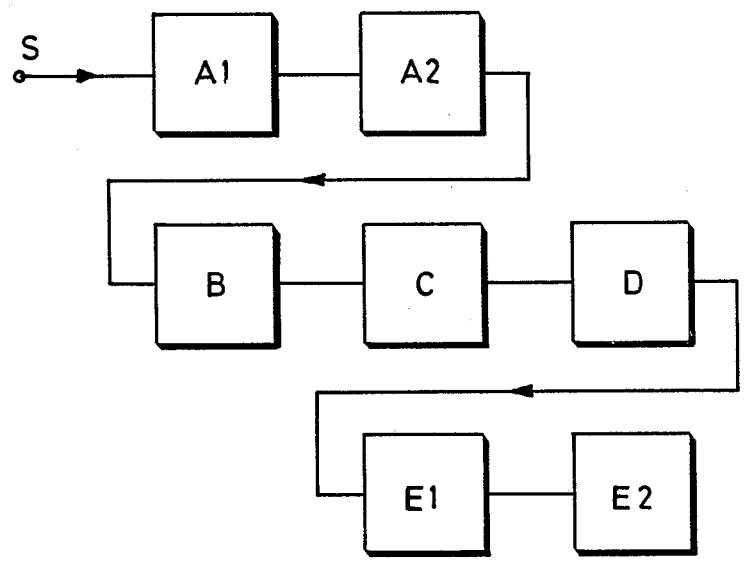
FIG. 1 very schematically shows the general structure of a known oscilloscope.
Figure 2:
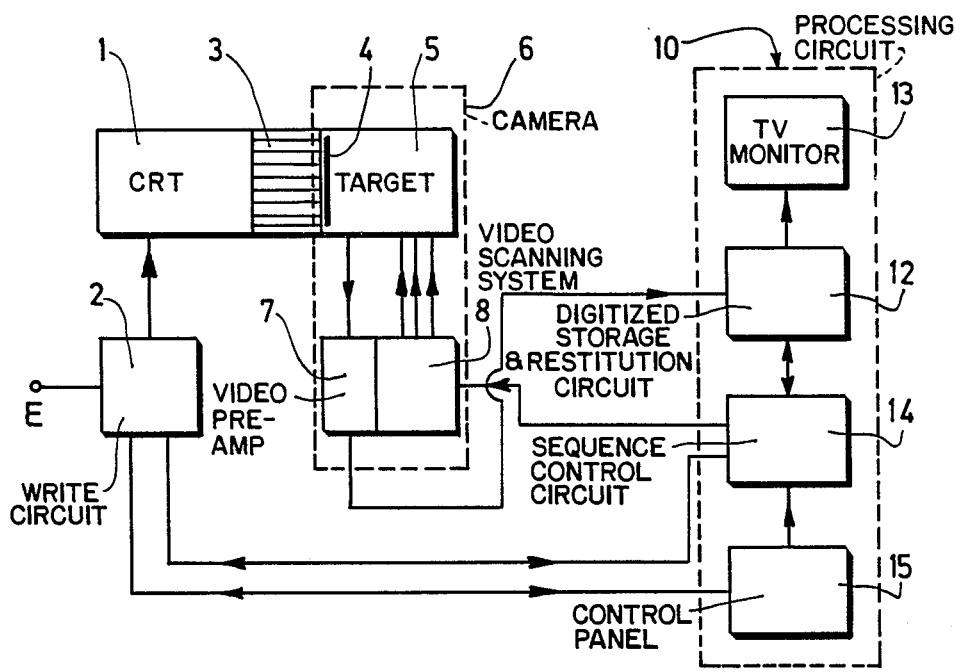
FIG. 2 shows the general structure of an oscilloscope in accordance with the invention.

The oscilloscope shown in FIG. 2, in which the storage and processing apparatus in accordance with the invention is incorporated, comprises a cathode-ray tube 1 which has a screen identical to that of an oscilloscope but which is smaller because the user does not view the trace on said screen directly. This tube, which may be equipped with a microchannel plate, receives the beam deflection and control signals from conventional oscilloscope write circuits 2. By the coupling side of the screen, on which optical fibres 3 are arranged, the image corresponding to the electrical event appearing on input E is transferred to the light-integrating target 4 of the camera tube 5 of a television camera 6 as a luminous trace, which is referred to as write signal; the target 4 functions as a temporary analogue memory for the electrical charge pattern corresponding to the luminous trace (in the present case the camera 6 is a television camera with a conventional light input but when a camera with an electronic input is used the write operation directly provides the electric charge pattern without a luminous trace being formed as an intermediate write signal).

Figure 3:
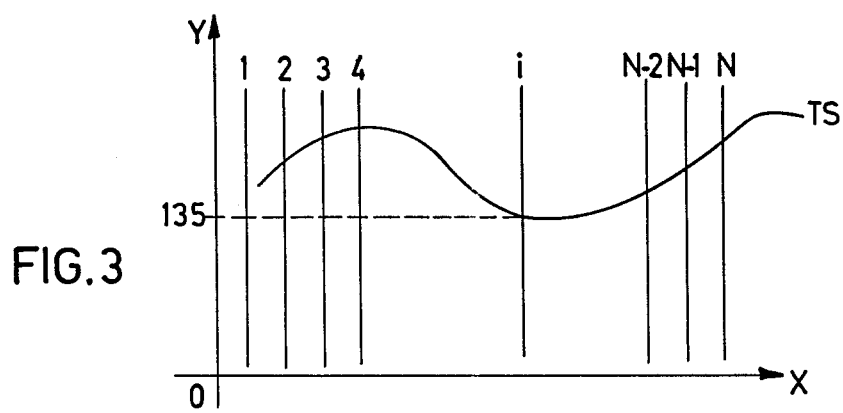
FIG. 3 illustrates the principle of digitization of the luminous trace on the target of the camera tube.

The electric signals obtained by reading the charge pattern of the luminous trace are converted into video-frequency signals by a video preamplifier 7 with the aid of the video scanning system 8 of the camera. This system 8 scans the analogue memory in consecutive scanning lines parrallel to the amplitude axis on the display means of the oscilloscope so that the consecutive television lines of this scanning process correspond to consecutive time windows on the time axis, as is shown in FIG. 3 which, for the clarity of the description, at the same time shows the time and amplitude axes OX and OY of the display screen, the luminous trace TS, which is temporarily stored in the analogue memory, and the television lines 1 to N in the time windows defined by the scanning process.

The oscilloscope described moreover comprises the storage and processing apparatus in accordance with the invention, which in the present case comprises a processing circuit 10, which comprises (see FIG. 2) digitizing, storage and restitution circuits 12, a monitor 13 forming the actual display means for the oscilloscopic image, a sequence control circuit 14 which performs the principal synchronization and control function, and a control panel 15. This processing circuit 10 is connected to the video preamplifier 7, which may be used in conjunction with a circuit for correcting faults which are intrinsic of the analogue storage means.

Figure 4:
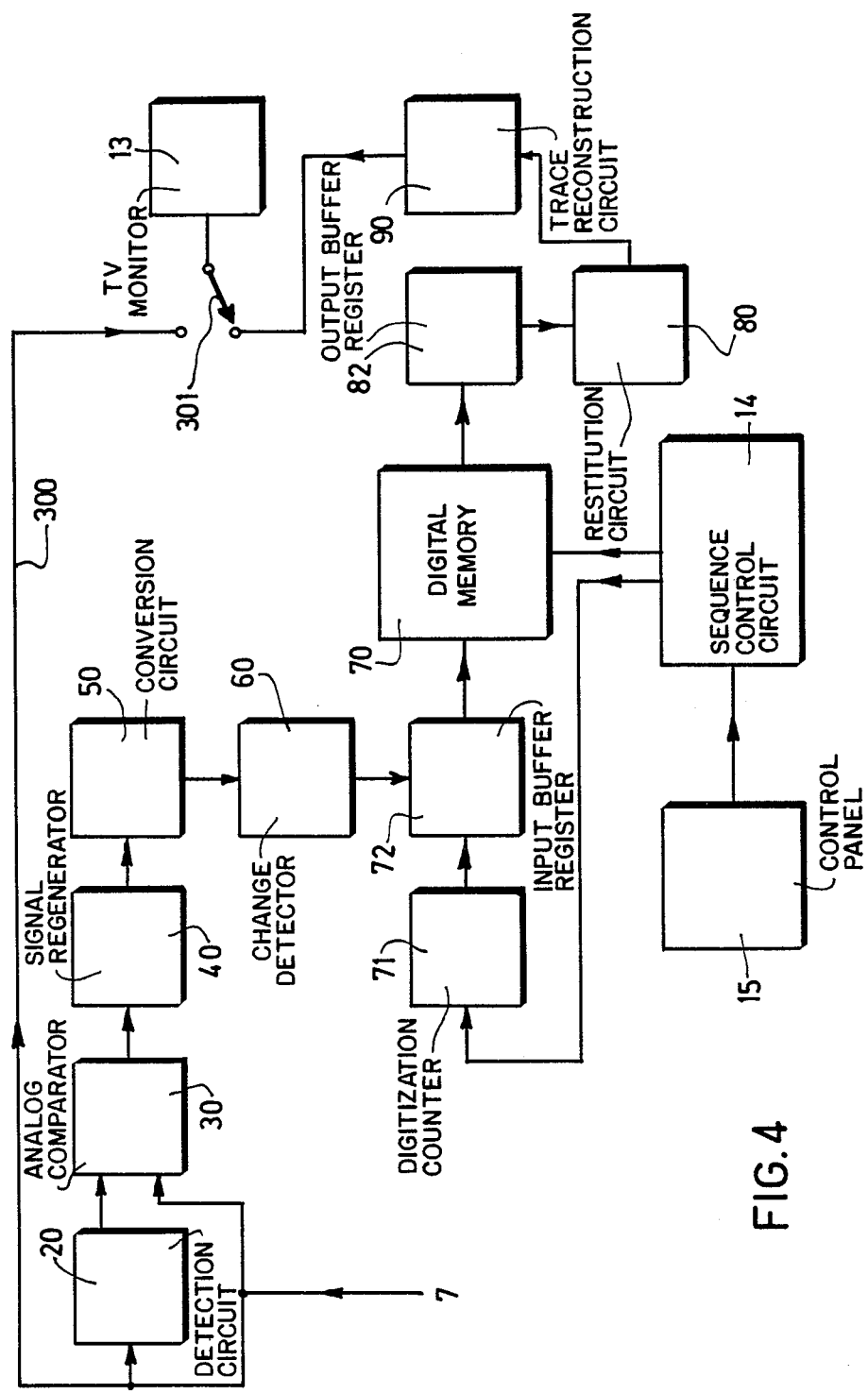
FIG. 4 shows the processing circuit 10 in FIG. 2 in detail.

The processing circuit 10, which is shown in more detail in FIG. 4, comprises the following stages: a detection circuit 20 for detecting the black level of the analogue memory (the target 4), an analogue comparator 30, a signal regenerator 40, a conversion circuit 50, a change detector 60, a digital memory 70, a restitution circuit 80, a reconstruction circuit 90, the television monitor 13, the sequence control circuit 14, and the control panel 15, the circuits 20 to 90 being rearranged in FIG. 2, in which the digitizing, storage and restitution circuits are designated 12.

The black level detection circuit 20 for the analogue memory receives the output signal from the video preamplifier 7 and derives the average black level, which corresponds to the used part of the target 4 from this signal. A constant voltage is added to this detected value in order to obtain a reference threshold value for the analogue comparator 30 on the output of the circuit 20. This threshold should be as low as possible in order to preclude the apparatus of a visible spot on the actual display means (the monitor 13) in the absence of a signal on the screen of the cathode-ray tube 1. The limit is imposed by the noise which should not reach the threshold when no trace is written on the target 4 (such as thermal noise of the video preamplifier 7, surface irregularity of the target of the tube of the television camera 6, inhomogeneity especially in the optical transmission paths, which can be reduced by various means: filtering, compensation for the variation of the dark current of the target 4 as a function of the temperature, correction for the distortion of the target, . . . ).

On a first input the analogue comparator 30 receives the output signal of the video preamplifier 7 and on a second input it receives the reference threshold value which is defined by the detection circuit 20. The output signal of the comparator 30 is a binary signal having a constant amplitude corresponding to the value "1" during time intervals in which the output signal of the video preamplifier exceeds the threshold value.

Figure 5A:
FIGS. 5a to 5c show the change in the video-signal waveform as a function of the inclination of the trace.
Figures 5B, 5C:
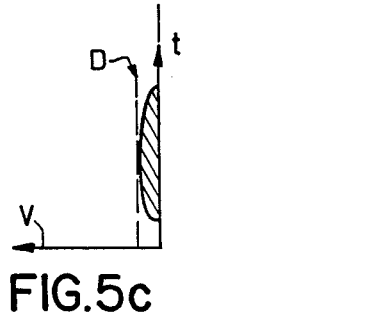
Figure 6:
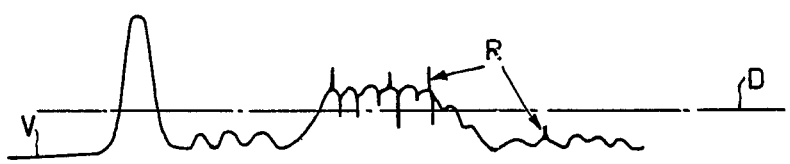
FIG. 6 illustrates how portions of the trace disappear.

It is to be noted that the video signal V exceeds the threshold signal D during a time which varies substantially as a function of the inclination of the trace (see FIG. 5a) relative to the scanning lines described by the camera 6. The signal energy, which is transferred pointwise to the target, is also variable and may become too small along a television line, which means that the maximum instantaneous write-signal (or trace) speed that can be stored is reached within one of the time windows of the video scanning system of the camera. Thus, taking into account the maximum brightness of the beam for the analogue memory and the brightness setting of the write beam for which a horziontal trace which is not too thick is obtained and also with the maximum sensitivity of the camera 6 (and the noise of its video preamplifier 7 and various other noise sources), it is found that the reference threshold value D can no longer be reached permanently (for this see FIGS. 5b and 5c), as a result of which parts of the stored luminous trace are lost (FIG. 6 clearly illustrates the influence of noise R on the video signal V and the resulting loss of parts of the trace), the remaining parts forming a series of distinct segments along a vertical television line. The signal regenerator 40 is then rendered operative to reconstruct the missing parts of the trace which are shorter than a predetermined duration, for example a sixty-fourth part of the height of the display screen or approximately 500 nanoseconds (i.e. a duration which is at least equal to several periods of the sampling operation to be carried out by the conversion circuit 50). This conditional regeneration is not applied for longer durations in order not to affect the resolution between two independent traces which are spaced by more than one sixty-fourth of the height of the screen. Thus, the presence of the signal regenerator 40 does not alter the length of the "segments" formed by the squarewaves on the output of the comparator 30 if these segments are spaced by more than 500 nanoseconds. There is even provided an adjustment facility for reducing the length of isolated segments to some extent in order to enhance the horizontal portions of the trace which is eventually displayed on a monitor 13.

The binary signal thus reconstructed is applied to the conversion circuit 50 which converts it into a train of pulses of equal duration which in the present example follow each other with a sampling frequency of 8 MHz defined by a clock circuit in the sequence control circuit 14. By means of this pulse signal the change detector 60 defines the positions of the rising and falling edges of the binary signal, which is effected with an accuracy which is of course limited to a half period of the sampling frequency. The output of the detector 60 is formed by a series of pulse signals which mark the beginnings and ends of the trace segments.

At this stage of the processing operation the actual digitization of the luminous trace contained in the analogue memory is effected. At the beginning of the scan of each television line, in each of the consecutive time windows, a digitization counter 71 for the amplitude axis of the display means is set to zero and starts to count pulses (in the present case maximum 256). When an event is detected on the video read current, i.e. when the video-frequency signal corresponding to the luminous trace is detected while scanning a line, the decision is taken to store the count which indicates the position of the event on the line (see FIG. 3 which, by way of example, shows a video-frequency signal which appears during the scanning of the line i when the counter is at 135). The quantized values thus defined for each line by the counter 71 are successively loaded into the input buffer register 72, and then they are stored in the digital memory 70, so that they represent the positions of the pulse signals which indicate the beginnings and ends of the segments on the vertical amplitude-axis of the monitor 13.

The oscilloscopic image to be displayed on the television monitor 13 may be presented to the operator in the direct video mode (under what conditions will be explained hereinafter) or in the stored video mode through reconstruction by means of the information stored in the digital memory 70. For this reconstruction in the stored video mode the processing circuit 10 further comprises a restitution circuit 80 which, via an output buffer register 82, receives the values read into the digital memory 70 and which plots indication signals on the time axis, which signals mark the instants which are characteristic of the beginning or end of a segment (without which this circuit cannot determine whether it concerns a beginning or an end) and a segment-reconstruction circuit 90 which reconstructs the segments between the associated beginning and end positions (the first position encountered being a starting position). The image is then finally displayed on the television monitor, each reconstructed segment being displayed on the corresponding scanning line (which is vertical).

The sequence control circuit 14, which performs the synchronization and control functions, more specifically serves to ensure the synchronous supply of a clock signal for scanning the analogue memory formed by the video read system 8 (in the present case with a frequency of 8 MHz) and a clock signal for the conversion of the binary logic signal on the output of the signal regenerator 40, further to provide clock signals for the transfer and storage in the digital memory 70, and to provide the operator-oscilloscope communication. This communication is possible by means of the control panel 15 by means of which the operator can enter his instruction, for example a request to renew the image, which enables the scanning function with the renewal request in its turn necessitating a choice between separate scanning or repeated scanning by means a variable oscillator, while in addition scanning may be started automatically or at a specific instant of the signal to be examined.

The final image quality depends on the acquisition quality of the signals stored in the digital memory, which in its turn depends on the reliability of the decision to store the values of the counter 71 and consequently on the signal-to-noise ratio which obtains before this decision. Therefore it is necessary to analyze the energy profile of the signal on the target 4 for each television line, in particular because the energy is not available instantaneously as a result of excitation and extinction delays of the phosphor and the integrating target and because it is not known in which field the maximum energy for a specific line will occur.

Figure 7:
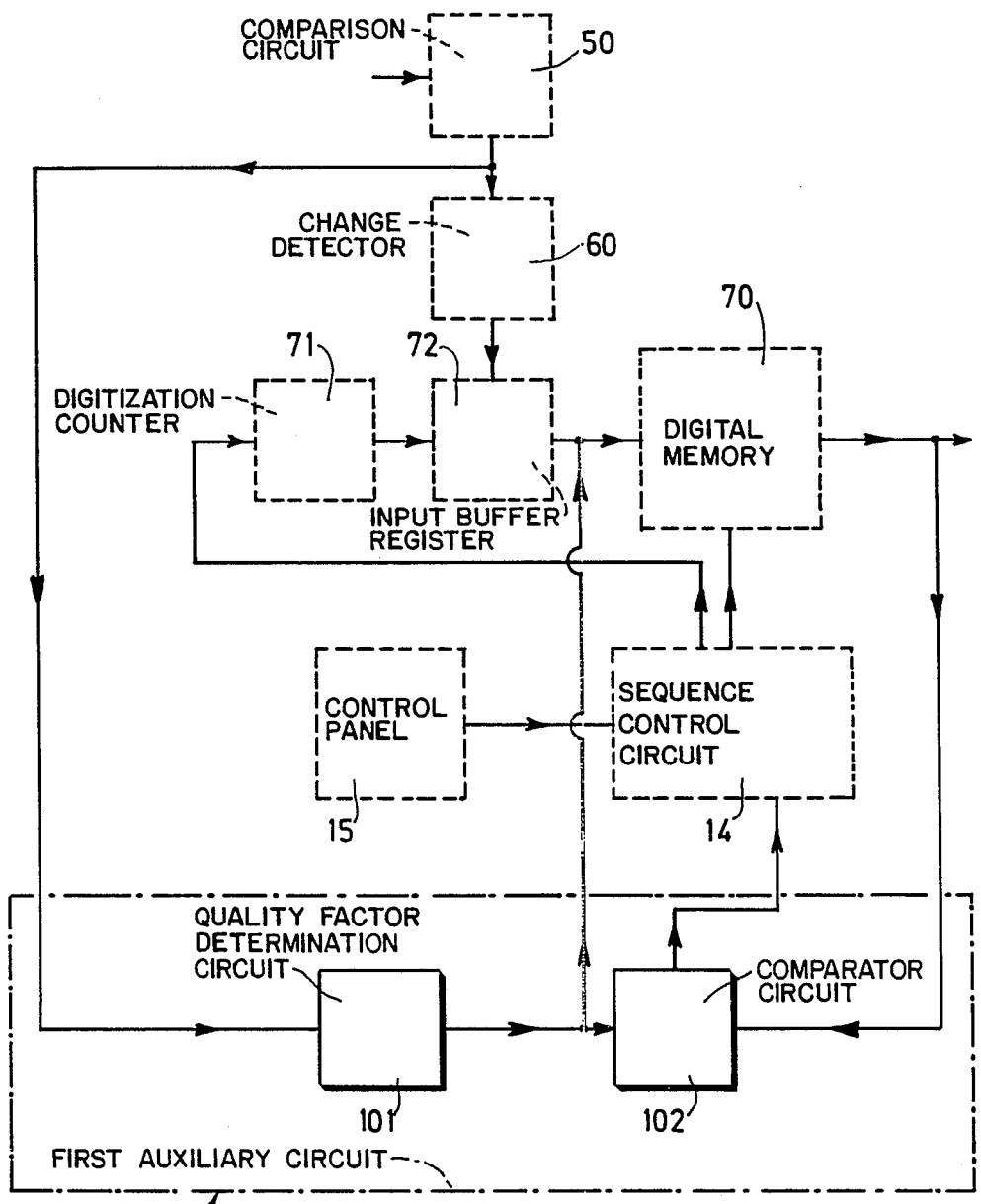
FIG. 7 shows how a first auxiliary circuit, for detecting the acquisition quality, is connected to the main processing circuit of FIG. 2.

This analysis is effected by means of a confidence factor attributed to each consecutive contents of the digital memory. The confidence factor is determined by means of a first auxiliary circuit 100, referred to as the acquisition-quality detection circuit, which is incorporated in the processing circuit 10 and is shown in FIG. 7. The circuit 100 comprises a cicuit 101 for determining the quality factor of the line which is stored directly in the input buffer register 72 and a comparator 102 for the quality factors of the directly stored line and of the same line which has been stored in the digital memory 70 during an arbitrary previous field. When the writing scan starts (for example in response to an image-renewal request from the operator) an initiation signal, which appears in the memory for the duration of a field, erases the preceding image and sets the quality factor to zero with the write energy that can already be detected during the write operation in progress being stored in the memory.

The quality factor, it is determined through proportionality with the time interval during which the amplitude of the video-frequency signal exceeds the reference threshold value, is subsequently stored in the digital memory 70 at the same time as the associated principal information which corresponds to the luminous trace produced by the analogue memory. However, this storage is not effected until the respective quality factors of the associated principal consecutive data have been compared, the principle data which (together with the corresponding quality factor) is to be loaded into the digital memory 70 being that to which the highest quality factor is attributed after this comparison. This storage depending on the value of the quality factor, which is the element to be compared between the read-outs, moreover ensures that the luminous entire trace is recorded by storage of the various adjoining portions of the trace in the digital memory. Thus, and this is very important for a general-purpose oscilloscope, the quality of the result is independent of the ratio between the sweep times of the oscilloscope and of the camera is also independent of any phase difference between these two scans.

Figure 8:
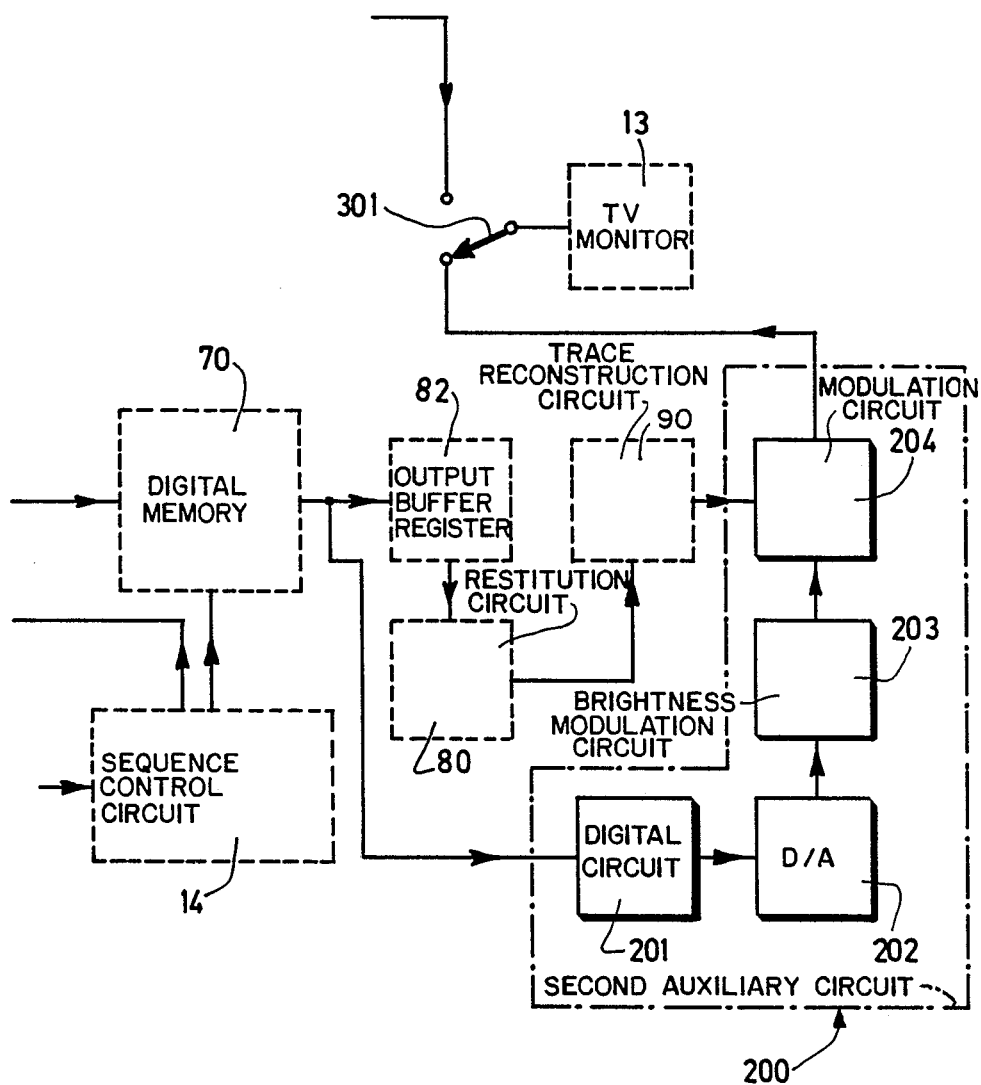
FIG. 8 shows how a second auxiliary circuit, for detecting the rate of visibility, is connected to the main processing circuit of FIG. 2.

As stated, the final image quality depends on the acquisition quality of the signals in the digital memory but it also depends on the processing after the read-out of the information stored in the digital memory 70. The oscilloscope described here comprises a second auxiliary circuit 200, called rate-of-visibility detection circuit, which is also incorporated in the circuit 10 and is shown in FIG. 8. This circuit 200 comprises a digital circuit 201, for determining the cumulative length of the segments for a given television line of the scan, from each contents consecutively read from the digital memory 70, a digital-to-analogue converter 202, a circuit 203 for adapting the brightness-modulation profile, and a modulation circuit 204 which carries out the analogue multiplication of the output signal of the segment-reconstruction circuit 90 by the output signal of the circuit 203. The output signal of the modulation circuit 204 is applied to the monitor 13.

As stated in the foregoing, the value of the reference-threshold applied to the comparator 30 by the black-level detection circuit 20 for the analogue memory can no longer be reached temporarily sometimes with a consequent loss of portions of the stored trace. Although short signal losses on the vertical axis are compensated for by the regenerator 40 it may happen that this value is no longer reached for a prolonged time or even permanently. The storage in the digital memory 70 and the processing by the processing circuit 10 then become impossible, even if the output signal of the video preamplifier 7 is adequate in order to obtain an image on the monitor 13. Since the circuit 10 can no longer operate, a third auxiliary circuit 300, called direct-transfer circuit, is incorporated in the processing circuit 10 in order to obtain the direct-video mode mentioned in the foregoing. In this mode of operation the output signal of the video preamplifier 7 is transferred directly to the monitor 13. A switch 301 arranged at the input of the monitor 13 in FIG. 8 enables change-over to the direct-video mode or a return to the stored-video mode with processing in the circuit 10 in response to a request from the operator.

It is obvious that the present invention is not limited to the present embodiment to which several variants are possible without departing from the scope of the invention. An example of such a variant may be to provide further processing, in addition to the principal processing in the circuit 10, by means of a computer arranged in parallel with the digital memory. Such additional processing may include enhancement of the trace, the suppression of points which deviate distinctly, an additional regeneration of the trace (for example through digital image filtration resulting in a suppression of long-term signal losses along the vertical axis), the restoration of the time continuity of the final trace on the screen of the monitor.

It is to be noted also that the nature of the camera does not limit the invention and that, in particular, a television camera equipped with a tube (as in the present example) or a solid-state camera with a conventional light input may be used or a camera having an electronic input (i.e. in which the charge pattern is produced directly by the write beam).

What is claimed is:

1. An apparatus for storing and processing arbitrary analog signals comprising
   a camera having a target providing images for a temporary analog memory, said camera including a video scanning system for scanning said temporary analog memory, and a video preamplifier for converting electrical signals of said images into video frequency signals; and
   a processing circuit receiving signals from said video preamplifier for processing said video frequency signals, said processing circuit including
   (a) a detection circuit for detecting an average black level value corresponding to used parts of said temporary analog memory, said detection circuit receiving output signals from said video preamplifier, and said detector circuit generating a reference threshold value by adding a constant voltage to said detected average black level value;
   (b) an analog comparator circuit for receiving said output signals of said video preamplifier on a first input and for receiving said reference threshold value on a second input, said comparator circuit for providing a logic "1" signal only when said output values exceed said reference threshold value,
   (c) a signal regenerator circuit receiving a signal from said analog comparator circuit for reconstructing missing parts of maximum instantaneous write signals, said missing parts having a duration shorter than a predetermined value, said signal regenerator circuit providing a binary signal representing said missing parts;
   (d) a conversion circuit for converting said binary signal into a pulse train of the same duration as said missing parts, said duration being equal to at least a few pulse periods of said pulse train for restoring said missing parts, said conversion circuit providing an output signal;
   (e) a change detector circuit for detecting positions of rising and falling edges of said output signal of said conversion circuit, said change detector circuit supplying pulse signals indicating beginnings and ends of said missing parts;
   (f) a digital memory circuit for storing positions of said beginnings and ends of said missing parts, said memory circuit being loaded by an input buffer register having quantized values being defined by a digitization counter, said values indicating positions of said pulse signals providing beginnings and ends of said missing parts;

(g) a circuit for restitution of positions of instants characteristic of a beginning or an end of a missing part, said restitution circuit receiving values read into said digital memory circuit by an output buffer register circuit;

(h) a circuit for reconstructing said missing parts between positions of said beginnings and ends of said missing parts;

(i) a television monitor means for forming display of said images, said monitor means enabling display of contents of said digital memory circuit permanently, said contents being information corresponding to write signals in said temporary analog memory;

(j) a sequence control circuit providing a synchronous supply of clock signals for scanning said temporary analog memory and clock signals for converting said binary signal of said signal regenerator, said sequence control circuit controlling clock signals for said digital memory circuit, and said sequence control circuit providing an entire operator write circuit communication; and (k) an accessible control panel.

2. An oscilloscope comprising an apparatus according to claim 1.

3. An apparatus according to claim 1, further comprising a first auxiliary circuit being an acquisition-quality detection circuit, wherein said first auxiliary circuit includes a circuit for determining a quality factor having a value related to the time that said video frequency signal has an amplitude exceeding said reference threshold value, said quality factor being stored in said digital memory circuit at the same time as associated principal data corresponding to a write signal in said temporary analog memory, and a comparator circuit for comparing quality factors of a line just stored and of said same line stored in said digital memory circuit during an arbitrary previous time, said associated principal data being data to which the highest quality factor is attributed after the comparison by said comparator circuit.

4. An apparatus according to claim 1 or claim 3, wherein a computer is arranged in parallel with said digital memory circuit for carrying out additional processing.

5. An apparatus according to claim 1 or claim 3, further comprising a second auxiliary circuit being a rate-of-visibility detection circuit, wherein said second auxiliary circuit includes a digital circuit for determining cumulative lengths of segments for a given television line effected by said camera from each contents consecutively read from said digital memory circuit, a digital-to-analog converter, a circuit for adapting a brightness modulation profile, and a modulation circuit for carrying out analog multiplication of respective output signals of said reconstructing circuit and of said brightness modulation profile circuit, said modulation circuit supplying signals to said television monitor means.

6. An apparatus according to claim 5, further comprising a third auxiliary circuit being switchable, wherein said third auxiliary circuit provides direct transfer of output signals of said video preamplifier to said television monitor means, and wherein said third auxiliary circuit operates only when said reference threshold value is not reached for a sufficiently long time and when storage by said digital memory circuit is no longer possible even though said output signals of said video preamplifiers permit a visible image to be obtained.

7. An apparatus according to claim 6, wherein a computer is arranged in parallel with said digital memory circuit for carrying out additional processing.

8. An apparatus according to claim 5, wherein a computer is arranged in parallel with said digital memory circuit for carrying out additional processing.

9. An apparatus according to claim 1 or claim 3, further comprising a third auxiliary circuit being switchable, wherein said third auxiliary circuit provides direct transfer of output signals of said video preamplifier to said television monitor means, and wherein said third auxiliary circuit operates only when said reference threshold value is not reached for a sufficiently long time and when storage by said digital memory circuit is no longer possible even though said output signals of said video preamplifiers permit a visible image to be obtained.

10. An apparatus according to claim 9, wherein a computer is arranged in parallel with said digital memory circuit for carrying out additional processing.

* * * * *